US012777890B2

(12) United States Patent
Takebayashi et al.

(10) Patent No.: US 12,777,890 B2
(45) Date of Patent: Oct. 27, 2026

(54) MEMBER FOR SEMICONDUCTOR MANUFACTURING APPARATUS WITH REDUCED ABNORMAL ELECTRICAL DISCHARGE

(71) Applicant: NGK INSULATORS, LTD., Nagoya-City (JP)

(72) Inventors: Hiroshi Takebayashi, Handa (JP); Jyunya Waki, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 106 days.

(21) Appl. No.: 18/735,576

(22) Filed: Jun. 6, 2024

(65) Prior Publication Data

US 2025/0149370 A1 May 8, 2025

Related U.S. Application Data

(63) Continuation of application No. PCT/JP2023/039549, filed on Nov. 2, 2023.

(51) Int. Cl.
*H10P 72/72* (2026.01)
*H01J 37/32* (2006.01)

(52) U.S. Cl.
CPC ...... *H10P 72/722* (2026.01); *H01J 37/32541* (2013.01); *H01J 37/32724* (2013.01); *H01J 2237/002* (2013.01); *H01J 2237/2007* (2013.01)

(58) Field of Classification Search
CPC ............... H10P 72/722; H10P 72/0432; H10P 72/0434; H10P 72/72; H01J 37/32541;
(Continued)

(56) References Cited

U.S. PATENT DOCUMENTS

2017/0170047 A1* 6/2017 Nakamura ........ H01J 37/32724
2017/0352567 A1 12/2017 Cho et al.
(Continued)

FOREIGN PATENT DOCUMENTS

JP 2005-136350 A 5/2005
JP 2020-205379 A 12/2020
(Continued)

OTHER PUBLICATIONS

International Search Report and Written Opinion (Application No. PCT/JP2023/039549) dated Dec. 19, 2023 (8 pages).
(Continued)

*Primary Examiner* — Monica Lewis
*Assistant Examiner* — Nicolas Bellido
(74) *Attorney, Agent, or Firm* — Muncy, Geissler, Olds & Lowe, P.C.

(57) ABSTRACT

A member for semiconductor manufacturing apparatus includes: a ceramic plate having a wafer placement surface on its upper surface and a built-in electrostatic electrode; a base plate provided on a lower surface of the ceramic plate, and configured to include a built-in refrigerant flow path; a passage provided from a lower surface of the base plate to the wafer placement surface of the ceramic plate; at least one inner electrode provided inside the ceramic plate so as to be located in a periphery of the passage under the electrostatic electrode and not to be exposed to an inner wall of the passage, the at least one inner electrode being electrically coupled to the electrostatic electrode; and a bias electrode provided electrically independently from the electrostatic electrode at a height equal to or lower than a height of a lowermost inner electrode of the at least one inner electrode.

6 Claims, 8 Drawing Sheets

(58) Field of Classification Search
CPC ........... H01J 37/32724; H01J 2237/002; H01J 2237/2007; H01J 37/32568; H01J 37/32715
See application file for complete search history.

(56) References Cited

U.S. PATENT DOCUMENTS

| | | | | |
|---|---|---|---|---|
| 2020/0402777 | A1 | 12/2020 | Sasaki et al. | |
| 2022/0246451 | A1* | 8/2022 | Takebayashi | H10P 72/0432 |
| 2023/0087660 | A1 | 3/2023 | Ishikawa et al. | |
| 2023/0090650 | A1* | 3/2023 | Ishikawa | H01J 37/32174 156/345.34 |
| 2023/0290622 | A1* | 9/2023 | Takebayashi | H01J 37/32 |
| 2023/0317430 | A1* | 10/2023 | Morioka | H01J 37/32174 156/345.51 |
| 2024/0222091 | A1* | 7/2024 | Ito | H01J 37/32715 |
| 2025/0149310 | A1* | 5/2025 | Takebayashi | H01J 37/32568 |

FOREIGN PATENT DOCUMENTS

| | | | | |
|---|---|---|---|---|
| JP | 2022-119239 | A | 8/2022 | |
| JP | 2023-044634 | A | 3/2023 | |
| WO | WO-2023095707 | A1 * | 6/2023 | H10P 72/7611 |

OTHER PUBLICATIONS

English translation of the International Preliminary Report on Patentability (Chapter I) for International Application No. PCT/JP2023/039549 dated May 15, 2026.

* cited by examiner

MEMBER FOR SEMICONDUCTOR MANUFACTURING APPARATUS WITH REDUCED ABNORMAL ELECTRICAL DISCHARGE

BACKGROUND OF THE INVENTION

1. Field of the Invention

The present invention relates to a member for semiconductor manufacturing apparatus.

2. Description of the Related Art

Conventionally, members for semiconductor manufacturing apparatus have been known which include: a ceramic plate having a wafer placement surface on its upper surface and a built-in electrode; a base plate provided on the lower surface of the ceramic plate; and a gas passage provided from the lower surface of the base plate to the wafer placement surface of the ceramic plate. In PTL 1, such a member for semiconductor manufacturing apparatus is provided with a cylindrical shield electrode in a periphery of the gas passage of the ceramic plates. The cylindrical shield electrode has a function of shielding the internal space of the gas passage from the effect of an electric field generated around an electrostatic electrode due to application of a direct-current voltage to the electrostatic electrode. Thus, occurrence of abnormal electrical discharge in the gas passage is prevented or reduced.

CITATION LIST

Patent Literature

PTL 1: International Publication No. 2023/095707

SUMMARY OF THE INVENTION

However, in PTL 1, when the shielding by the shield electrode is insufficient, occurrence of abnormal electrical discharge in the gas passage may not be prevented.

The present invention has been devised to solve the above-mentioned problem, and it is a main object to prevent or reduce occurrence of abnormal electrical discharge in a passage by a principle different from a conventional one.

[1]A member for semiconductor manufacturing apparatus of the present invention includes: a ceramic plate having a wafer placement surface on its upper surface and a built-in electrostatic electrode; a base plate provided on a lower surface of the ceramic plate, and configured to include a built-in refrigerant flow path; a passage provided from a lower surface of the base plate to the wafer placement surface of the ceramic plate; at least one inner electrode provided inside the ceramic plate so as to surround the passage under the electrostatic electrode and not to be exposed to an inner wall of the passage, the at least one inner electrode being electrically coupled to the electrostatic electrode; and a bias electrode provided electrically independently from the electrostatic electrode at a position equal to or lower than a height of a lowermost inner electrode of the at least one inner electrode, the bias electrode being configured so that a bias voltage is applied when generating a plasma over the wafer placement surface.

In the member for semiconductor manufacturing apparatus, at least one inner electrode electrically coupled to the electrostatic electrode is provided inside the ceramic plate so as to surround the passage under the electrostatic electrode and not to be exposed to the inner wall of the passage. When a direct-current is applied to the electrostatic electrode, and a bias voltage is applied to the bias electrode, an electric potential gradient is generated in the internal space of the passage in an up-down direction. In the present invention, at least one inner electrode is provided under the electrostatic electrode, thus the vertical distance over which the electric potential gradient is generated is shorter as compared to when no inner electrode is provided. As a result, even if electrons ionized from the atoms or molecules of a heat transfer gas are accelerated by the electric potential gradient, the electrons are not sufficiently accelerated, and don't receive sufficient energy, thus arc discharge can be avoided. Therefore, it is possible to prevent or reduce occurrence of abnormal electrical discharge in the passages by a principle different from a conventional one by which the effect of an electric field generated around the electrostatic electrode is shielded.

In the present description, “upper”, “lower” do not represent absolute positional relationship, but represent relative positional relationship. Thus, depending on the orientation of the member for semiconductor manufacturing apparatus, “upper” and “lower” may indicate “lower” and “upper”, “left” and “right”, or “front” and “back”. As the “passage”, e.g., a gas passage and a lift pin hole may be mentioned. When only one “inner electrode” is provided, the “inner electrode” is “the lowermost inner electrode”.

[2] In the member for semiconductor manufacturing apparatus (the member for semiconductor manufacturing apparatus according to [1]) of the present invention, the base plate may also serve as the bias electrode. In this setting, a bias electrode does not need to be provided separately from the base plate.

[3] In the member for semiconductor manufacturing apparatus (the member for semiconductor manufacturing apparatus according to [1]) of the present invention, the bias electrode may be built in the ceramic plate.

[4] In the member for semiconductor manufacturing apparatus (the member for semiconductor manufacturing apparatus according to [3]) of the present invention, the bias electrode may be provided under the lowermost inner electrode.

[5] In the member for semiconductor manufacturing apparatus (the member for semiconductor manufacturing apparatus according to [3]) of the present invention, the bias electrode may be provided at a height equal to a height of the lowermost inner electrode, and provided in a periphery of the lowermost inner electrode.

[6] In the member for semiconductor manufacturing apparatus (the member for semiconductor manufacturing apparatus according to any one of [1] to [5]) of the present invention, the at least one inner electrode may be a ring-shaped electrode that surrounds a periphery of the passage, or an electrode being same in shape as the electrostatic electrode and having a through-hole through which the passage penetrates. When the inner electrode is a ring-shaped electrode, the electrode materials to be used can be small in amount. When the inner electrode is same in shape as the electrostatic electrode, the design flexibility of the wire to electrically connect the inner electrode and the electrostatic electrode is increased because the inner electrode has a relatively large area. Note that the “same shape” indicates that the shape (for example, a circle or a quadrilateral) is the same, and the size may be the same or may be different.

[7] In the member for semiconductor manufacturing apparatus (the member for semiconductor manufacturing apparatus according to any one of [1] to [6]) of the present invention, the passage may be coupled to a supply source of heat transfer gas. In this setting, in the internal space of the passage, the following phenomenon is likely to occur: the atoms or molecules of a heat transfer gas are ionized to produce electrons which collide with other atoms or molecules, therefore, the significance of application of the present invention is high.

[8] In the member for semiconductor manufacturing apparatus (the member for semiconductor manufacturing apparatus according to any one of [1] to [7]) of the present invention, the base plate may also serve as a source electrode that a source voltage is applied when generating a plasma over the wafer placement surface. In this setting, a source electrode does not need to be provided separately from the base plate.

DETAILED DESCRIPTION OF THE INVENTION

Figure 1:
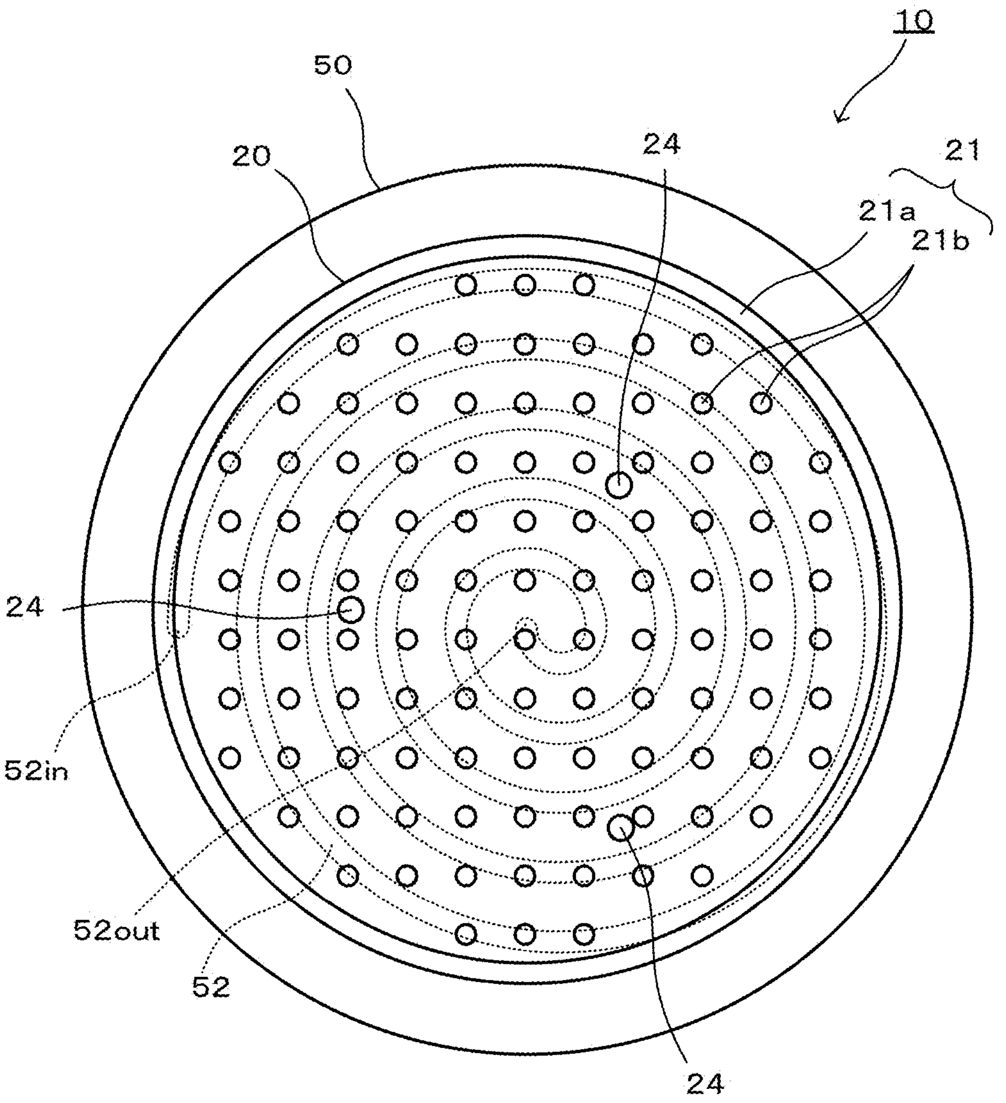
FIG. 1 is a plan view of a wafer placement table 10.
Figure 2:
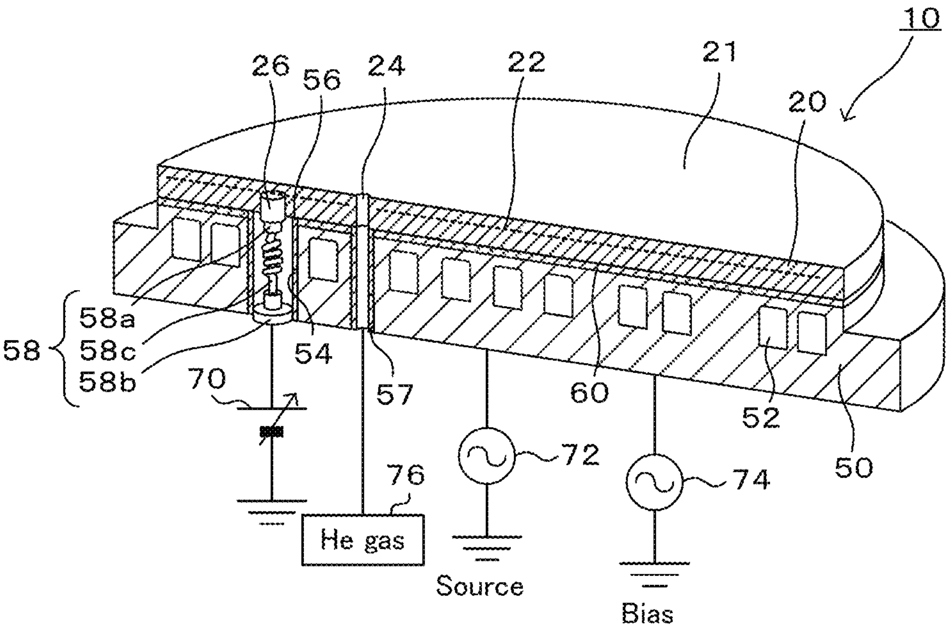
FIG. 2 is a perspective view of the wafer placement table 10 with a cross-sectional view.
Figure 3:
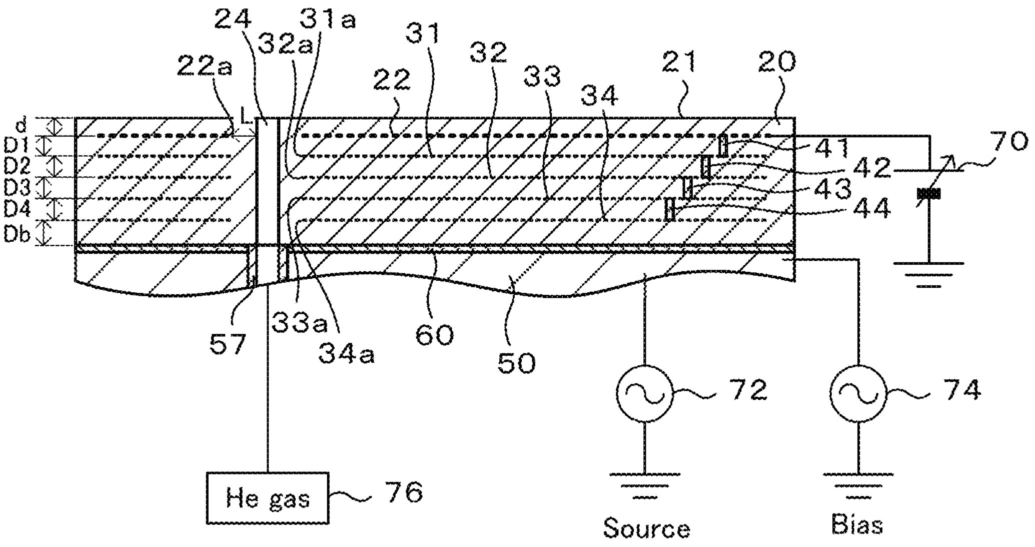
FIG. 3 is a partial cross-sectional view of the wafer placement table 10.
Figure 4:
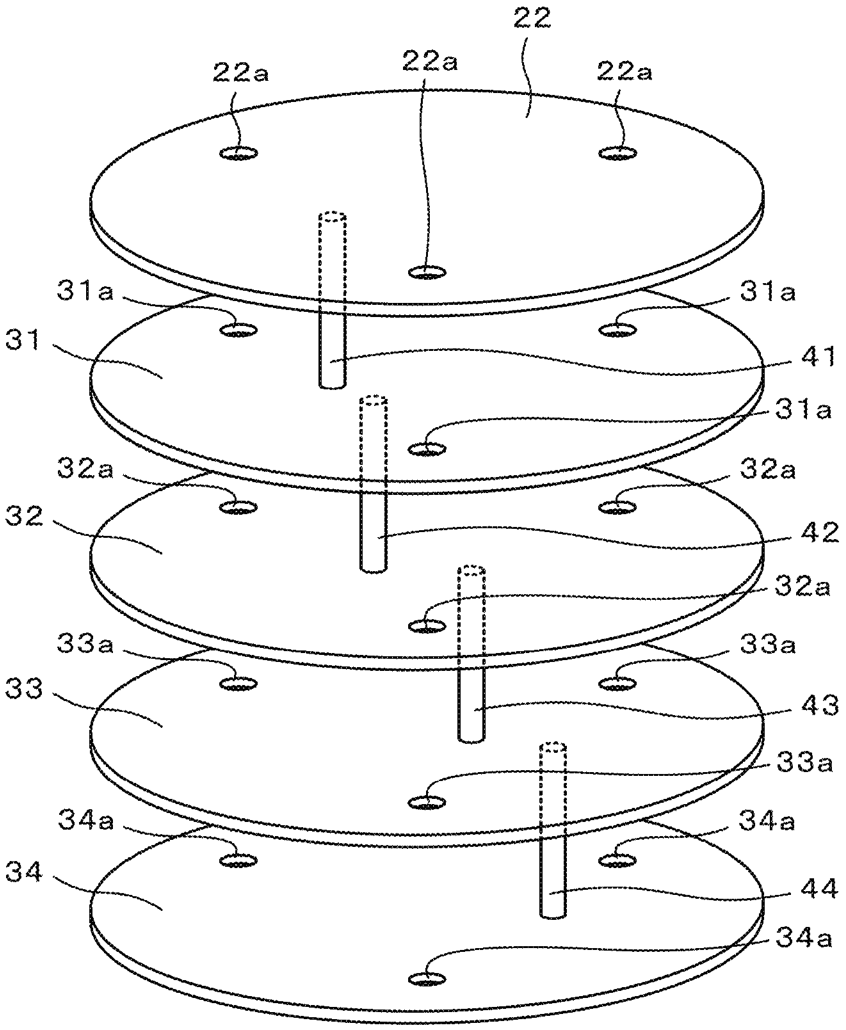
FIG. 4 is a perspective view illustrating a positional relationship between an electrostatic electrode 22 and first to fourth inner electrodes 31 to 34.

A preferred embodiment of the present invention will be described with reference to the drawings. FIG. 1 is a plan view of a wafer placement table 10, FIG. 2 is a perspective view of the wafer placement table 10 with a cross-sectional view, FIG. 3 is a partial cross-sectional view of the wafer placement table 10, and FIG. 4 is a perspective view illustrating a positional relationship between an electrostatic electrode 22 and first to fourth inner electrodes 31 to 34. Note that in FIG. 2 and FIG. 3, a seal band 21*a* and small circular projections 21*b* are omitted. In FIG. 2, the first to fourth inner electrodes 31 to 34 are omitted, and in FIG. 3, an electrode terminal 26, a power supply member 58, and a power supply member arrangement hole 54 are omitted.

The wafer placement table 10 is an example of a member for semiconductor manufacturing apparatus of the present invention, and as illustrated in FIG. 2, includes a ceramic plate 20, a base plate 50, a bonding layer 60, a power supply member arrangement hole 54, and a gas passage 24.

The ceramic plate 20 is a ceramic circular disk (e.g., a diameter of 300 mm, a thickness of 5 mm) such as an alumina sintered body or an aluminum nitride sintered body. The upper surface of the ceramic plate 20 is a wafer placement surface 21. The ceramic plate 20 has a built-in electrostatic electrode 22. As illustrated in FIG. 1, on the wafer placement surface 21, a seal band 21*a* is formed along the outer edge, and a plurality of small circular projections 21*b* are formed on the entire inner surface of the seal band 21*a*. The seal band 21*a* and the small circular projections 21*b* have the same height which is e.g., several μm to several 10 μm. The electrostatic electrode 22 is a circular planar mesh electrode, and coupled to a direct-current power supply 70 via a power supply member 58. When a direct-current voltage is applied to the electrostatic electrode 22, the wafer W is attracted and fixed to the wafer placement surface 21 (specifically, the upper surface of the seal band 21*a* and the upper surface of the small circular projections 21*b*) by an electrostatic attraction force, and when the application of the direct-current voltage is stopped, the attraction and fixing of the wafer W to the wafer placement surface 21 is released.

As illustrated in FIG. 3 and FIG. 4, the inside of the ceramic plate 20 is provided with the first to fourth inner electrodes 31 to 34 arranged in order from the top, and the fourth inner electrode 34 is located at the lowest position. Each of the first to fourth inner electrodes 31 to 34 is provided under the electrostatic electrode 22. The first to fourth inner electrodes 31 to 34 are provided inside the ceramic plate 20 so as to surround the gas passage 24 and not to be exposed to the inner wall of the gas passage 24. The first to fourth inner electrodes 31 to 34 are each a planar circular mesh electrode having the same shape as the electrostatic electrode 22, and has substantially the same size as the electrostatic electrode 22. The electrostatic electrode 22 and the first inner electrode 31 are electrically coupled via a first via 41 extending in a vertical direction (i.e. an up-down direction), the first inner electrode 31 and the second inner electrode 32 are electrically coupled via a second via 42 extending in a vertical direction, the second inner electrode 32 and the third inner electrode 33 are electrically coupled via a third via 43 extending in a vertical direction, and the third inner electrode 33 and the fourth inner electrode 34 are electrically coupled via a fourth via 44 extending in a vertical direction. Thus, the first to fourth inner electrodes 31 to 34 have the same potential as the electrostatic electrode 22. When seen in a vertical direction, the first to fourth vias 41 to 44 are not arranged in a straight line, and are misaligned. As illustrated in FIG. 3, distance D1 between the electrostatic electrode 22 and the first inner electrode 31, distance D2 between the first inner electrode 31 and the second inner electrode 32, distance D3 between the second inner electrode 32 and the third inner electrode 33, distance D4 between the third inner electrode 33 and the fourth inner electrode 34, and distance Db between the fourth inner electrode 34 and the lower surface of the ceramic plate 20 are preferably greater than or equal to one time the distance d between the wafer placement surface 21 and the electrostatic electrode 22.

The base plate 50 is a circular disk (e.g., a circular disk with a diameter equal to or greater than the diameter of the ceramic plate 20, and a thickness of 25 mm) having good electrical conductivity and thermal conductivity, and is electrically independent from the electrostatic electrode 22 and the first to fourth inner electrodes 31 to 34. The inside of the base plate 50 is provided with a refrigerant flow path 52 through which a refrigerant is circulated. The refrigerant which flows through the refrigerant flow path 52 is preferably liquid, and preferably has electrical insulating properties. As the liquid having electrical insulating properties, e.g., fluorine-based inert liquid may be mentioned. As illustrated in FIG. 1, the refrigerant flow path 52 is formed from one end (inlet 52in) to the other end (outlet 52out) in a swirl shape in a one-stroke pattern over the entirety of the base plate 50 in a plan view. The inlet 52in and the outlet 52out of the refrigerant flow path 52 are respectively coupled to a supply port and a collection port of an external refrigerant device which is not illustrated. The refrigerant supplied from the supply port of the external refrigerant device to the inlet 52in of the refrigerant flow path 52 passes through the refrigerant flow path 52, then returns from the outlet 52out of the refrigerant flow path 52 to the collection port of the external refrigerant device, undergoes temperature adjustment, and is supplied again from the supply port to the inlet 52in of the refrigerant flow path 52. The base plate 50 is coupled to a source power supply 72 and a bias power supply 74. The source power supply 72 is a power supply that generates source RF to produce a plasma over the wafer placement surface 21. The bias power supply 74 is a power supply that generates bias RF to attract ions to the wafer W. The bias RF has a lower frequency and a larger amplitude than the source RF. The bias RF may have sine wave (positive and negative appear alternately), or may have rectangular wave (negative rectangle appears periodically); however, rectangular wave is preferable for sharp etching. The frequency of the source RF is e.g., several 10 to several 100 MHz, and the frequency of the bias RF is e.g., several 100 kHz.

As the material for the base plate 50, e.g., a metal material and a composite material of metal and ceramic may be mentioned. As the metal material, Al, Ti, Mo or an alloy thereof may be mentioned. As the composite material of metal and ceramic, a metal matrix composite material (MMC) and a ceramic matrix composite material (CMC) may be mentioned. As a specific example of such a composite material, a material containing Si, SiC and Ti (also referred to as SiSiCTi), a material obtained by impregnating a SiC porous body with Al and/or Si, and a composite material of $Al_2O_3$ and TiC may be mentioned. As the material for the base plate 50, a material having a coefficient of thermal expansion closer to that of the material for the ceramic plate 20 is preferably selected.

The bonding layer 60 is a metal bonding layer herein, and bonds the lower surface of the ceramic plate 20 and the upper surface of the base plate 50 together. The metal bonding layer may be a layer composed of e.g., solder or a metal brazing material. The metal bonding layer is formed by e.g., TCB (Thermal compression bonding). The TCB is a publicly known method by which a metal bonding material is inserted between two members to be bonded, and the two members are bonded by pressurizing while heating at a temperature lower than or equal to the solidus temperature of the metal bonding material. Note that the bonding layer 60 may be a resin adhesive layer. As the material for the resin adhesive layer, e.g., an insulating resin such as an epoxy resin, an acrylic resin, and a silicone resin, and in addition, an insulating resin containing a filler may be mentioned.

As illustrated in FIG. 2, the power supply member arrangement hole 54 is a substantially cylindrical hole that penetrates the base plate 50 and the bonding layer 60 in a vertical direction, and is provided so as not to penetrate the refrigerant flow path 52. An insulating tube 56 is stored in the power supply member arrangement hole 54. The insulating tube 56 is fixed to the power supply member arrangement hole 54 by an adhesive agent. An electrode terminal 26 electrically coupled to the electrostatic electrode 22 is exposed to the upper base of the power supply member arrangement hole 54. A power supply member 58 is electrically coupled to the electrode terminal 26. The power supply member 58 is obtained by connecting an upper metal terminal 58*a* and a lower metal terminal 58*b* by a flexible metal wire 58*c*, and the upper metal terminal 58*a* is bonded to the electrode terminal 26. The lower metal terminal 58*b* is exposed from the lower opening of the insulating tube 56, and coupled to the direct-current power supply 70 for electrostatic attraction. Note that the power supply member 58 may be a metal rod.

As illustrated in FIG. 2, the gas passage 24 is a substantially cylindrical hole that penetrates the base plate 50, the bonding layer 60 and the ceramic plate 20 in a vertical direction, and is provided so as not to penetrate the refrigerant flow path 52. The gas passage 24 is coupled to a He gas supply source 76. The gas passage 24 is provided from the lower surface of the base plate 50 to the wafer placement surface 21. Of the gas passage 24, the portion that penetrates the base plate 50 and the bonding layer 60 stores an insulating tube 57. The insulating tube 57 is fixed to the gas passage 24 by an adhesive agent. As illustrated in FIG. 3, the gas passage 24 penetrates the electrostatic electrode 22 and the first to fourth inner electrodes 31 to 34 in a vertical direction. The portion of the electrostatic electrode 22, through which the gas passage 24 passes, and the portion of the first to fourth inner electrodes 31 to 34, through which the gas passage 24 passes, are provided with through-holes 22*a*, 31*a* to 34*a* with a diameter greater than the diameter of the gas passage 24. Therefore, the electrostatic electrode 22 and the first to fourth inner electrodes 31 to 34 are not exposed to the inner wall of the gas passage 24. Length L between the gas passage 24 and the through-hole 22*a* of the electrostatic electrode 22 is preferably greater than or equal to two times the distance d between the wafer placement surface 21 and the electrostatic electrode 22. The lengths between the gas passage 24 and the through-holes 31*a* to 34*a* of the first to fourth inner electrodes 31 to 34 are also preferably greater than or equal to two times the distance d.

Next, a method of manufacturing the ceramic plate 20 of the wafer placement table 10 will be briefly described. The ceramic plate 20 can be obtained such that e.g., six molding sheets are produced, each molding sheet is processed, then laminated and hot press fired, and subsequently, shape machining (such as hole drilling) is performed thereon. For example, the first molding sheet from the top is used as it is without being processed. For the second molding sheet from the top, a conductive paste is printed on the upper surface thereof so that the second molding sheet has the same shape as the electrostatic electrode 22, and the position of the first via 44 is provided with a via filled with a conductive paste. For the third to fifth molding sheets from the top, a conductive paste is printed on the upper surface thereof so that the third to fifth molding sheets have the same shape as the first to third inner electrodes 31 to 33, respectively. And each of the positions of the second to fourth vias 42 to 44 is provided with a via filled with a conductive paste. For the sixth molding sheet from the top, a conductive paste is printed on the upper surface thereof so that the sixth molding sheet has the same shape as the fourth inner electrode 34. Each molding sheet can be produced by tape molding or mold cast molding. These six sheets are laminated, and hot press fired, and subsequently, shape machining (such as hole drilling) is performed thereon. Note that the gas passage 24 may be formed before the hot press firing, or formed after the hot press firing.

Next, a use example of thus configured wafer placement table 10 will be described. First, the wafer W is placed on the wafer placement surface 21 with the wafer placement table 10 installed in a chamber which is not illustrated. The inside of the chamber is depressurized by a vacuum pump, and adjusted to a predetermined degree of vacuum, and a direct-current voltage is applied to the electrostatic electrode 22 of the ceramic plate 20 to generate an electrostatic attraction force to cause the wafer W to be attracted and fixed to the wafer placement surface 21. He gas is supplied to the gas passage 24 from the He gas supply source 76. The He gas is filled in the space surrounded by the seal band 21*a*, the small circular projections 21*b* and the wafer W. Thus, heat transfer between the wafer W and the wafer placement surface 21 becomes favorable. Next, a reactive gas atmosphere having a predetermined pressure (e.g., several 10 to several 100 Pa) is created in the chamber, and in this state, a source voltage from the source power supply 72 and a bias voltage from the bias power supply 74 are applied to the base plate 50. A plasma is then generated between an upper electrode (not illustrated) provided in the ceiling portion in the chamber and the wafer placement surface 21 of the wafer placement table 10. The surface of the wafer W is treated by the generated plasma. A refrigerant is circulated through the refrigerant flow path 52 of the base plate 50 as appropriate.

Here, an electric potential gradient from positive to negative in a vertical direction is generated in the internal space of the gas passage 24 along with application of a direct-current voltage to the electrostatic electrode 22 and application of a bias voltage to the base plate 50 which serves as a bias electrode. In this embodiment, the first to fourth inner electrodes 31 to 34 having the same potential as the electrostatic electrode 22 are provided inside the ceramic plate 20. Thus, no vertical electric potential gradient is generated between the electrostatic electrode 22 and the fourth inner electrode 34 in the internal space of the gas passage 24. Meanwhile, an electric potential gradient from positive to negative is generated between the fourth inner electrode 34 and the base plate 50 serving as a bias electrode. But the vertical length over which an electric potential gradient is generated is approximately the same as the distance between the fourth inner electrode 34 and the base plate 50, thus is short. Therefore, even if electrons generated due to ionization of He atoms are accelerated and collide with other He atoms in the internal space of the gas passage 24, the distance for the acceleration is short, thus the electrons do not gain high energy, and even if the electrons collide with other He atoms, abnormal electrical discharge does not occur.

In contrast, when the first to fourth inner electrodes 31 to 34 are not provided inside the ceramic plate 20, the vertical length over which an electric potential gradient is generated in the internal space of the gas passage 24 is longer than the distance in this embodiment. Thus, if electrons generated due to ionization of He atoms are accelerated and collide with other He atoms in the internal space of the gas passage 24, the electrons gain high energy due to the long acceleration distance, and those electrons collide with other He atoms, causing the He atoms to be ionized, further generating electrons, and this phenomenon is likely to occur repeatedly. Therefore, abnormal electrical discharge is likely to occur.

In the wafer placement table 10 described in detail above, the first to fourth inner electrodes 31 to 34 electrically coupled to the electrostatic electrode 22 are provided inside the ceramic plate 20 so as to surround the gas passage 24 (i.e. so as to be located in a periphery of the gas passage 24) under the electrostatic electrode 22 and not to be exposed to the inner wall of the gas passage 24. The electrostatic electrode 22 has a positive potential when a direct-current voltage is applied thereto to attract the wafer W to the wafer placement surface 21. The base plate 50 serving as a bias electrode has a negative potential periodically when a bias voltage is applied thereto to draw ions in a plasma. Thus, a potential with a gradient from positive to negative in a vertical direction is generated in the internal space of the gas passage 24. When a heat transfer gas such as He gas is present in the gas passage 24, electrons ionized from He atoms are accelerated by an electric field, and collide with other unionized He atoms, which may cause arc discharge ultimately. In this embodiment, the first to fourth inner electrodes 31 to 34 are provided under the electrostatic electrode 22, thus the vertical distance over which an electric potential gradient is generated becomes short. As a result, even if electrons ionized from He atoms are produced, those electrons are not sufficiently accelerated by an electric potential gradient, and do not gain sufficient energy, thus occurrence of arc discharge can be avoided. Therefore, occurrence of abnormal electrical discharge in each passage 24 can be prevented or reduced.

Furthermore, the base plate 50 also serves as a bias electrode. Therefore, it is not necessary to provide a bias electrode separately from the base plate 50.

In addition, the first to fourth inner electrodes 31 to 34 have the same shape (circular planar electrode) as the electrostatic electrode 22, and have a relatively large area, thus the design flexibility of the first to fourth vias 41 to 44 is increased. The size of the first to fourth inner electrodes 31 to 34 may be the same as, slightly greater than, or slightly less than the size of the electrostatic electrode 22.

Furthermore, the gas passage 24 is coupled to the He gas supply source 76. Thus, in the internal space of the gas passage 24, the following phenomenon is likely to occur: He atoms are ionized, producing electrons which collide with other He atoms, thus application of the present invention has high significance.

In addition, the base plate 50 also serves as a source electrode. Therefore, it is not necessary to provide a source electrode separately from the base plate 50.

In addition, when seen in a vertical direction, the first to fourth vias 41 to 44 are not arranged in a straight line, and are misaligned. In this case, as compared to when the first to fourth vias 41 to 44 are arranged in a straight line, the possibility of cracking at the portions provided with the first to fourth vias 41 to 44 at the time of production of the ceramic plate 20 by firing is reduced due to the difference in thermal expansion between ceramic and metal, which is preferable. That is, in this embodiment, when seen in a vertical direction, the first to fourth vias 41 to 44 are misaligned, thus the difference in thermal expansion at the time of firing is reduced, and cracking is unlikely to occur at the portions provided with the first to fourth vias 41 to 44.

Note that the present invention is not limited to the above-described embodiment at all, and it is needless to say that the present invention can be carried out in various forms as long as the forms belong to the technical scope of the present invention.

In the above-described embodiment, the base plate 50 also serves as a bias electrode; however, a bias electrode may be built in the ceramic plate 20.

Figure 5:
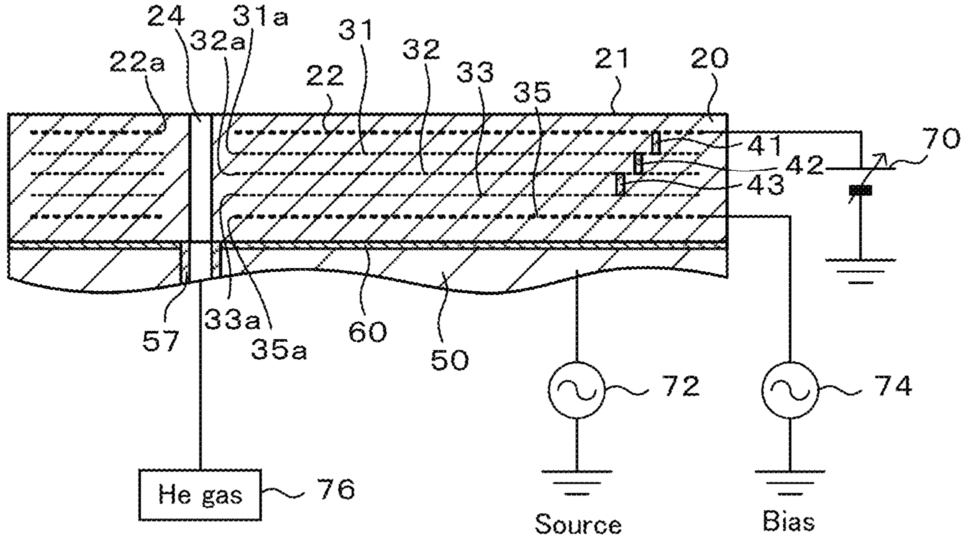
FIG. 5 is a partial cross-sectional view of another embodiment.

For instance, in FIG. 5, an example is illustrated in which a bias electrode 35 is provided instead of the fourth inner electrode 34 of the above-described embodiment. In FIG. 5, the same components as in the above-described embodiment are labeled with the same symbol. The bias electrode 35 is neither electrically coupled to the electrostatic electrode 22 nor the first to third inner electrodes 31 to 33, but is coupled to the bias power supply 74. The portion of the bias electrode 35, through which the gas passage 24 passes is provided with a through-hole 35*a* with a diameter greater than the diameter of the gas passage 24. Therefore, the bias electrode 35 is not exposed to the inner wall of the gas passage 24. The length between the gas passage 24 and the through-hole 35*a* of the bias electrode 35 is preferably greater than or equal to two times the distance d between the wafer placement surface 21 and the electrostatic electrode 22. The distance between the bias electrode 35 and the lower surface of the ceramic plate 20 is preferably greater than or equal to one time the distance d. In the case of FIG. 5, the first to third inner electrodes 31 to 33 having the same potential as the electrostatic electrode 22 are provided under the electrostatic electrode 22, thus the vertical distance over which an electric potential gradient is generated is shorter as compared to when the first to third inner electrodes 31 to 33 are not provided. Thus, occurrence of abnormal electrical discharge in the gas passage 24 can be prevented or reduced.

Figure 6:
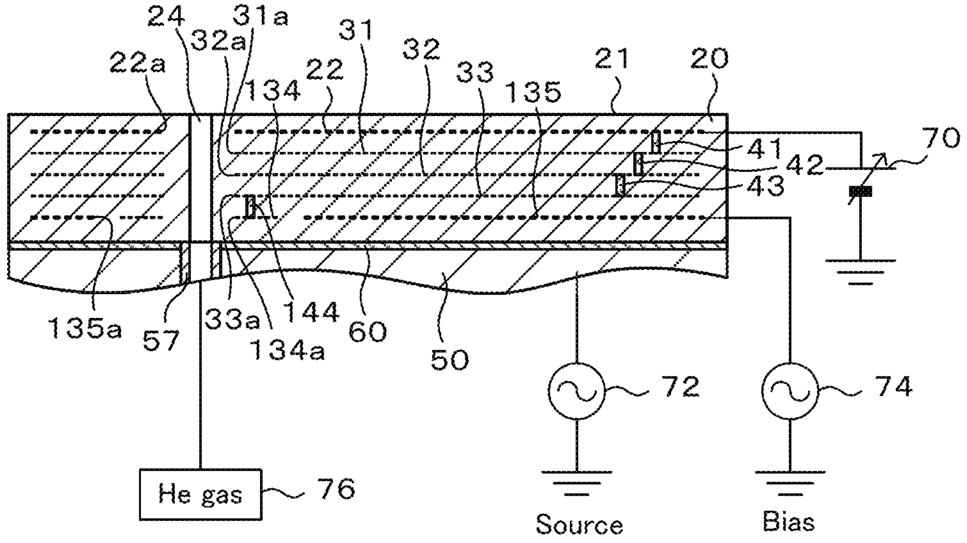
FIG. 6 is a partial cross-sectional view of another embodiment.
Figure 7:
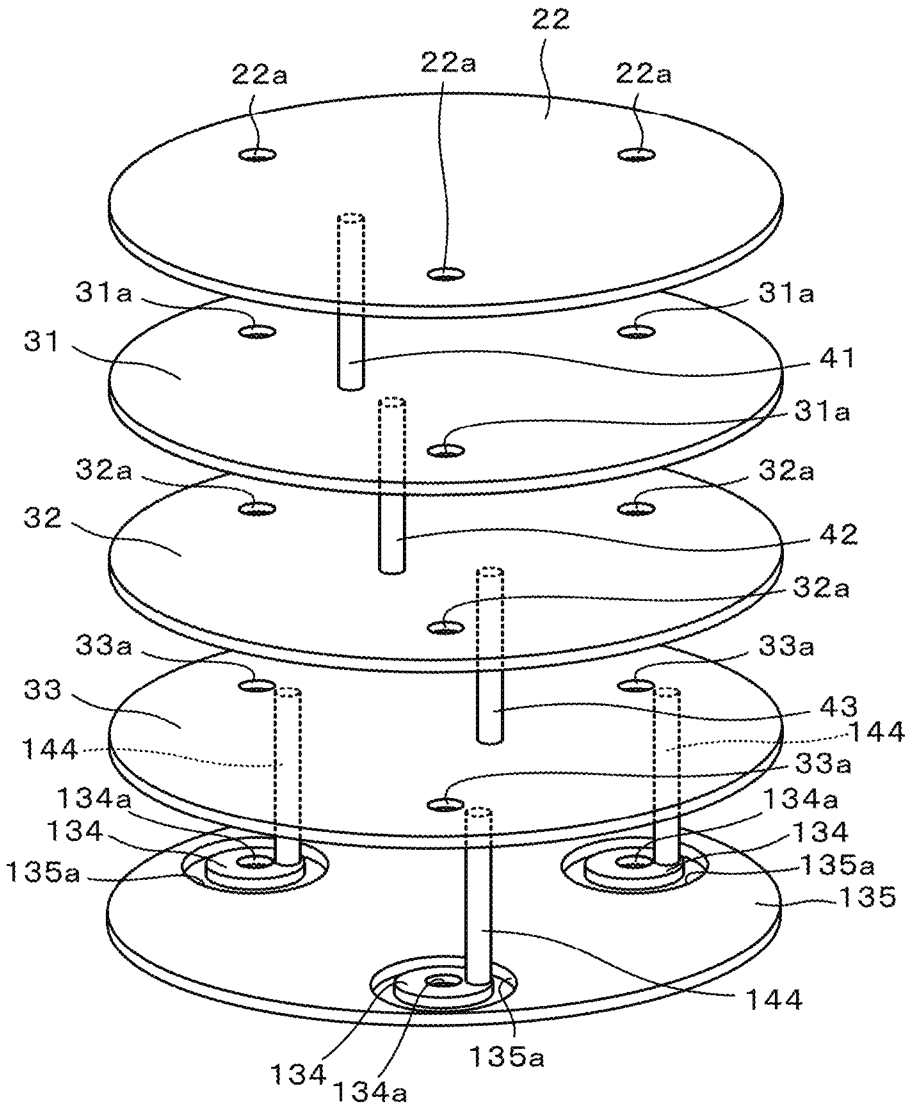
FIG. 7 is a perspective view illustrating a positional relationship between electrodes of another embodiment.

FIG. 6 and FIG. 7 illustrate an example in which a ring-shaped fourth inner electrode 134 is used instead of the fourth inner electrode 34 of the above-described embodiment, and a bias electrode 135 is built in the ceramic plate 20 so as to surround the fourth inner electrode 134. In FIG. 6 and FIG. 7, the same components as in the above-described embodiment are labeled with the same symbol. The fourth inner electrode 134 is provided so as to surround the gas passage 24. The portion of the fourth inner electrode 134, through which the gas passage 24 passes is provided with a through-hole 134*a* with a diameter greater than the diameter of the gas passage 24. Thus, the fourth inner electrode 134 is not exposed to the inner wall of the gas passage 24. The fourth inner electrode 134 is electrically coupled to the third inner electrode 33 via a via 144. Thus, the fourth inner electrode 134 has the same potential as the electrostatic electrode 22. The bias electrode 135 is provided on the same plane as the fourth inner electrode 134, and is not electrically coupled to the electrostatic electrode 22 nor to the first to fourth inner electrodes 31 to 33, 134, but is coupled to the bias power supply 74. The bias electrode 135 has a through-hole 135*a* which is provided with an interval from the fourth inner electrode 134. The distance between the third inner electrode 33 and the fourth inner electrode 134 (or the bias electrode 135) is preferably greater than or equal to one time the distance d between the wafer placement surface 21 and the electrostatic electrode 22. The distance between the gas passage 24 and the through-hole 134*a* of the fourth inner electrode 134, and the distance between the outer edge of the fourth inner electrode 134 and the inner edge of the through-hole 135*a* are preferably greater than or equal to two times the distance d. In the case of FIG. 6 and FIG. 7, the first to fourth inner electrodes 31 to 33, 134 having the same potential as the electrostatic electrode 22 are provided under the electrostatic electrode 22, thus the vertical distance over which an electric potential gradient is generated is shorter as compared to when the first to fourth inner electrodes 31 to 33, 134 are not provided. Therefore, occurrence of abnormal electrical discharge in the passage 24 can be prevented or reduced.

Figure 8:
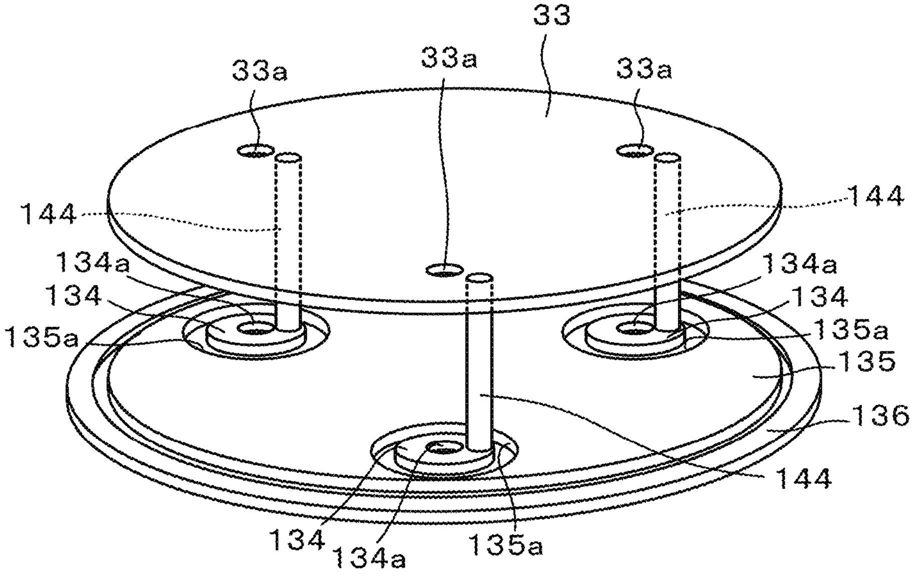
FIG. 8 is a perspective view illustrating a positional relationship between electrodes of another embodiment.

When the bias electrode is built in the ceramic plate 20, the outer circumference of the bias electrode may be provided with an outer bias electrode which is electrically independent from the bias electrode. FIG. 8 is an example in which the outer circumference of the bias electrode 135 of FIG. 7 is provided with an outer bias electrode 136. In FIG. 8, the same components as in FIG. 7 are labeled with the same symbol. In FIG. 8, the electrostatic electrode 22 and the first and second inner electrodes 31, 32 are omitted. The outer bias electrode 136 is a ring-shaped electrode provided on the same plane as the circular bias electrode 135, and is not electrically coupled to any of the electrostatic electrode 22, the first to fourth inner electrodes 31 to 33, 134, or the bias electrode 135. The distance between the inner edge of the outer bias electrode 136 and the outer edge of the bias electrode 135 is preferably greater than or equal to two times the distance d. In FIG. 8, different bias voltages can be applied to the bias electrode 135 and the outer bias electrode 136, respectively. Thus, the degree of attraction of ions can be changed between the central side and the outer circumferential side of the wafer W. Note that when a focus ring is placed on a step portion provided along the outer circumference of the ceramic plate 20, the degree of attraction of ions can be changed between the focus ring and the wafer W.

Figure 9:
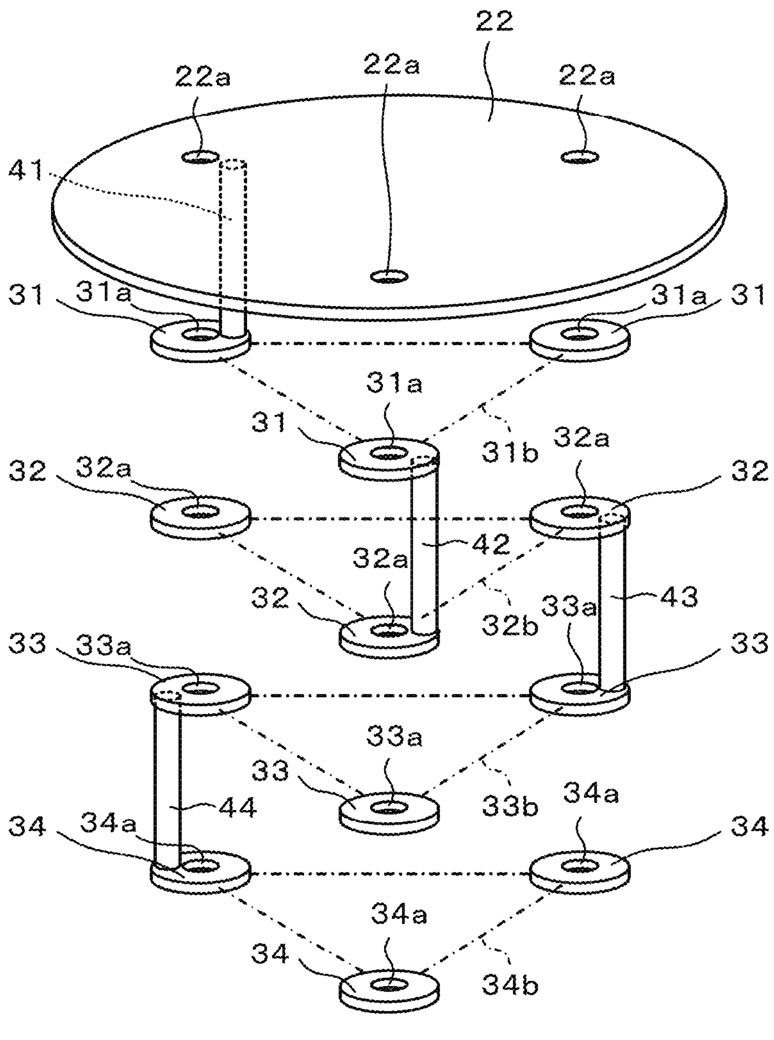
FIG. 9 is a perspective view illustrating a positional relationship between electrodes of another embodiment.

Although the first to fourth inner electrodes 31 to 34 have the same shape as the electrostatic electrode 22 in the above-described embodiment, the first to fourth inner electrodes 31 to 34 may be ring-shaped electrodes which surround the periphery of the gas passage 24. FIG. 9 illustrates an example. In FIG. 9, the same components as in the above-described embodiment are labeled with the same symbol. The first inner electrodes 31 are ring-shaped electrodes, and formed as many as the number of gas passages 24 (see FIG. 1) on the same plane. All the first inner electrodes 31 are electrically connected by a wire 31*b*, and one of those is coupled to the electrostatic electrode 22 via the first via 41. The second inner electrodes 32 are ring-shaped electrodes, and formed as many as the number of gas passages 24 on the same plane. All the second inner electrodes 32 are electrically connected by a wire 32*b*, and one of those is coupled to a first inner electrode 31 via the second via 42. The third inner electrodes 33 are ring-shaped electrodes, and formed as many as the number of gas passages 24 on the same plane. All the third inner electrodes 33 are electrically connected by a wire 33*b*, and one of those is coupled to a second inner electrode 32 via the third via 43. The fourth inner electrodes 34 are ring-shaped electrodes, and formed as many as the number of gas passages 24 on the same plane. All the fourth inner electrodes 34 are electrically connected by a wire 34*b*, and one of those is coupled to a third inner electrode 33 via the fourth via 44. Therefore, all the first to fourth inner electrodes 31 to 34 have the same potential as the electrostatic electrode 22. Even in this manner, the same effect as in the above-described embodiment is obtained. Note that the first via 41 may be provided on the wire 31*b* instead of being provided on the first inner electrode 31. This also applies to the second to fourth vias 42 to 44. The wire 31*b* may be omitted, and each first inner electrode 31 may be provided with the first via 41. This also applies to the second to fourth vias 42 to 44. Part of the first to fourth inner electrodes 31 to 34 may be ring-shaped electrodes, and the remaining electrodes may have the same shape as the electrostatic electrode 22.

In the above-described embodiment, the first to fourth inner electrodes 31 to 34 are provided inside the ceramic plate 20, but it is sufficient that the number of inner electrodes be at least one. For example, only the fourth inner electrode 34 may be provided inside the ceramic plate 20.

In the above-described embodiment, the electrostatic electrode 22 is built in the ceramic plate 20, but is not limited thereto. For example, in addition to the electrostatic electrode 22, a heater electrode (resistance heating element) may be built in.

In the above-described embodiment, a portion of the gas passage 24, where an electrical potential distribution occurs may be provided with a porous plug (a plug allowing a vertical gas flow). Alternatively, a compact plug having a zigzag or spiral passage (a passage allowing a vertical gas flow) may be adopted instead of a porous plug. In this setting, occurrence of abnormal electrical discharge at a portion where an electrical potential distribution occurs is more likely to be prevented.

In the above-described embodiment, the case has been illustrated in which three gas passages 24 are provided, but the number of gas passages 24 is not limited to three, and may be any number. The gas passage 24 is a passage that penetrates the wafer placement table 10 in a vertical direction, but is not limited to thereto. For example, instead of the gas passage 24, a gas channel structure may be adopted. As the gas channel structure, a structure may be adopted which includes: a ring-shaped passage provided inside the base plate 50 and concentric to the base plate 50 in a plan view; a gas inlet passage for introducing gas from the lower surface of the base plate 50 to the ring-shaped passage; and a plurality of gas distribution passages extending upward from the ring-shaped passage and open to the wafer placement surface 21. The number of gas inlet passages may be smaller than the number of gas distribution passages, for example, may be one. Such a gas channel structure also corresponds to a "passage" of the present invention.

In the above-described embodiment, a lift pin hole may be provided separately from the gas passage 24. The lift pin hole is a hole that penetrates the wafer placement table 10 in a vertical direction for inserting a lift pin to vertically move the wafer W with respect to the wafer placement surface 21. For example, when the wafer W is supported by three lift pins, three lift pin holes are provided. The configuration of the lift pin hole and its periphery is similar to the configuration of the gas passage 24 and its periphery. The lift pin hole is provided from the lower surface of the ceramic plate 20 to the wafer placement surface 21. Thus, although He gas also enters the lift pin hole, as in the gas passage 24, occurrence of abnormal electrical discharge in the lift pin hole can be prevented or reduced. Such a lift pin hole also corresponds to a "passage" of the present invention.

In the above-described embodiment, the direct-current power supply 70 is coupled to the electrostatic electrode 22, but instead, the direct-current power supply 70 may be coupled to one of the first to fourth inner electrodes 31 to 34.

International Application No. PCT/JP2023/039549, filed on Nov. 2, 2023, is incorporated herein by reference in its entirety.

What is claimed is:

1. A member for semiconductor manufacturing apparatus, comprising:

a ceramic plate having a wafer placement surface on its upper surface and a built-in electrostatic electrode;

a base plate provided on a lower surface of the ceramic plate, and configured to include a built-in refrigerant flow path;

a passage provided from a lower surface of the base plate to the wafer placement surface of the ceramic plate;

a plurality of inner electrodes provided in multiple steps in an up-down direction inside the ceramic plate so as to be located in a periphery of the passage under the built-in electrostatic electrode and not to be exposed to an inner wall of the passage, the plurality of inner electrodes being electrically coupled to the built-in electrostatic electrode; and a bias electrode provided electrically independently from the built-in electrostatic electrode at a height equal to or lower than a height of a lowermost inner electrode of the plurality of inner electrodes, the bias electrode being configured so that a bias voltage is applied when generating a plasma over the wafer placement surface; and wherein the bias electrode is built in the ceramic plate or wherein the base plate serves as the bias electrode.

2. The member for semiconductor manufacturing apparatus according to claim 1, wherein the bias electrode is provided under the lowermost inner electrode.

3. The member for semiconductor manufacturing apparatus according to claim 1, wherein the bias electrode is provided at a height equal to a height of the lowermost inner electrode, and provided in a periphery of the lowermost inner electrode.

4. The member for semiconductor manufacturing apparatus according to claim 1, wherein at least one of the plurality of inner electrodes is a ring-shaped electrode that surrounds a periphery of the passage, or an electrode being same in shape as the built-in electrostatic electrode and having a through-hole through which the passage penetrates.

5. The member for semiconductor manufacturing apparatus according to claim 1, wherein the passage is coupled to a supply source of heat transfer gas.

6. The member for semiconductor manufacturing apparatus according to claim 1, wherein the base plate also serves as a source electrode that a source voltage is applied when generating a plasma over the wafer placement surface.

* * * * *